(12) United States Patent
Nakibly et al.

(10) Patent No.: US 11,960,392 B1
(45) Date of Patent: Apr. 16, 2024

(54) CONFIGURABLE ROUTING IN A MULTI-CHIP SYSTEM

(71) Applicant: Amazon Technologies, Inc., Seattle, WA (US)

(72) Inventors: Guy Nakibly, Kedumim (IL); Dan Saad, Herut (IL); Yaniv Shapira, Beit Yitshak Sha'ar Hefer (IL); Erez Izenberg, Tel Aviv-Jaffa (IL)

(73) Assignee: Amazon Technologies, Inc., Seattle, WA (US)

( * ) Notice: Subject to any disclaimer, the term of this patent is extended or adjusted under 35 U.S.C. 154(b) by 317 days.

(21) Appl. No.: 17/643,127

(22) Filed: Dec. 7, 2021

(51) Int. Cl.
| | | |
|---|---|---|
| *G06F 13/14* | (2006.01) | |
| *G06F 9/46* | (2006.01) | |
| *G06F 12/02* | (2006.01) | |
| *G06F 13/16* | (2006.01) | |
| *G06F 13/38* | (2006.01) | |
| *G06F 13/42* | (2006.01) | |
| *G11C 11/408* | (2006.01) | |

(52) U.S. Cl.
CPC .......... *G06F 12/0238* (2013.01); *G06F 9/467* (2013.01); *G06F 12/0292* (2013.01); *G06F 13/1621* (2013.01); *G06F 13/38* (2013.01); *G06F 13/4221* (2013.01); *G11C 11/4087* (2013.01)

(58) Field of Classification Search
None
See application file for complete search history.

(56) References Cited

U.S. PATENT DOCUMENTS

| | | | | |
|---|---|---|---|---|
| 2013/0290582 | A1* | 10/2013 | Kothamasu | G06F 13/404 710/110 |
| 2015/0012679 | A1* | 1/2015 | Davis | G06F 13/4022 710/110 |
| 2015/0169495 | A1 | 6/2015 | Zheng | |
| 2017/0168954 | A1* | 6/2017 | Meyer | G06F 13/4068 |
| 2017/0315944 | A1 | 11/2017 | Mayer et al. | |

(Continued)

OTHER PUBLICATIONS

U.S. Appl. No. 17/457,812, filed Dec. 6, 2021, Saad et al.

(Continued)

*Primary Examiner* — Henry Tsai
*Assistant Examiner* — Dean Phan
(74) *Attorney, Agent, or Firm* — Weaver Austin Villeneuve & Sampson LLP

(57) ABSTRACT

A first configurable address decoder can be coupled between a source node and a first interconnect fabric, and a second address decoder can be coupled between the first interconnect fabric and a second interconnect fabric. The first address decoder can be configured with a first address mapping table that can map a first set of address ranges to a first set of target nodes connected to the first interconnect fabric. The second address decoder can be configured with a second address mapping table that can map a second set of address ranges to a second set of target nodes connected to the second interconnect fabric. The second address decoder can be part of the first set of target nodes. The first address decoder and the second address decoder can be configured or re-configured to determine different routes for a transaction from the source node to a target node in the second set of target nodes via the first and second interconnect fabrics.

20 Claims, 7 Drawing Sheets

FIRST ADDRESS MAPPING TABLE 300

| ADDRESS RANGE 300a | TARGET NODE IDENTIFIER (ID) 300b |
|---|---|
| 0x0000-0x007F | 0x01 |
| 0x0080-0x00FF | 0x02 |
| 0x1000-0x1FFF | 0x03 |
| 0x2000-0x2FFF | 0x04 |

SECOND ADDRESS MAPPING TABLE 302

| ADDRESS RANGE 302a | TARGET NODE IDENTIFIER (ID) 302b |
|---|---|
| 0xX000-0xX07F | 0x01 |
| 0xX080-0xX0FF | 0x02 |
| 0xX100-0xX1FF | 0x03 |
| 0xX200-0xX2FF | 0x04 |

(56) References Cited

U.S. PATENT DOCUMENTS

2020/0039524 A1    2/2020   Chu
2020/0192859 A1    6/2020   Jones et al.
2020/0264901 A1    8/2020   Camarota et al.
2023/0367510 A1*  11/2023   Fishwick .............. G06F 3/0659

OTHER PUBLICATIONS

U.S. Appl. No. 17/643,572, filed Dec. 9, 2021, Saad et al.
U.S. Notice of Allowance dated Jan. 6, 2023 in U.S. Appl. No. 17/457,812.

* cited by examiner

FIG. 3A

FIRST ADDRESS MAPPING TABLE
300

| ADDRESS RANGE 300a | TARGET NODE IDENTIFIER (ID) 300b |
|---|---|
| 0x0000-0x007F | 0x01 |
| 0x0080-0x00FF | 0x02 |
| 0x1000-0x1FFF | 0x03 |
| 0x2000-0x2FFF | 0x04 |

FIG. 3B

SECOND ADDRESS MAPPING TABLE
302

| ADDRESS RANGE 302a | TARGET NODE IDENTIFIER (ID) 302b |
|---|---|
| 0xX000-0xX07F | 0x01 |
| 0xX080-0xX0FF | 0x02 |
| 0xX100-0xX1FF | 0x03 |
| 0xX200-0xX2FF | 0x04 |

FIG. 3C

THIRD ADDRESS MAPPING TABLE
304

| ADDRESS RANGE 304a | TARGET NODE IDENTIFIER (ID) 304b |
|---|---|
| 0xXX00-0xXX7F | 0x01 |
| 0xXX80-0xXXFF | 0x02 |

FIG. 3D

UPDATED FIRST ADDRESS MAPPING TABLE
306

| ADDRESS RANGE 306a | TARGET NODE IDENTIFIER (ID) 306b |
|---|---|
| 0x0000-0x007F | 0x01 |
| 0x0080-0x00FF | 0x02 |
| 0x1000-0x1FFF | 0x04 |
| 0x2000-0x2FFF | 0x03 |

FIG. 3E

FOURTH ADDRESS MAPPING TABLE
308

| ADDRESS RANGE 308a | TARGET NODE IDENTIFIER (ID) 308b |
|---|---|
| 0xX000-0xX07F | 0x01 |
| 0xX080-0xX0FF | 0x02 |
| 0xX100-0xX1FF | 0x04 |
| 0xX200-0xX2FF | 0x3 | though
CONFIGURABLE ROUTING IN A MULTI-CHIP SYSTEM

BACKGROUND

A multi-chip system may include a plurality of system-on-chips (SoCs) to support functionalities that demand high performance and compute power such as cloud computing, databases, application hosting, machine learning, among others. Each SoC may include one or more interconnect fabrics, which may be connected to different source nodes and target nodes. A transaction issued by a source node on one SoC can be routed through multiple interconnect fabrics to reach a target node on another SoC.

BRIEF DESCRIPTION OF THE DRAWINGS

Various embodiments in accordance with the present disclosure will be described with reference to the drawings, in which:

FIG. 3A illustrates an example of a first address mapping table for a first address decoder, according to some embodiments;

FIG. 3B illustrates an example of a second address mapping table for a second address decoder, according to some embodiments;

FIG. 3C illustrates an example of a third address mapping table for a third address decoder, according to some embodiments;

FIG. 3D illustrates an example of an updated first address mapping table for the first address decoder, according to some embodiments;

FIG. 3E illustrates an example of a fourth address mapping table for a fourth address decoder, according to some embodiments;

DETAILED DESCRIPTION

Figure 1:
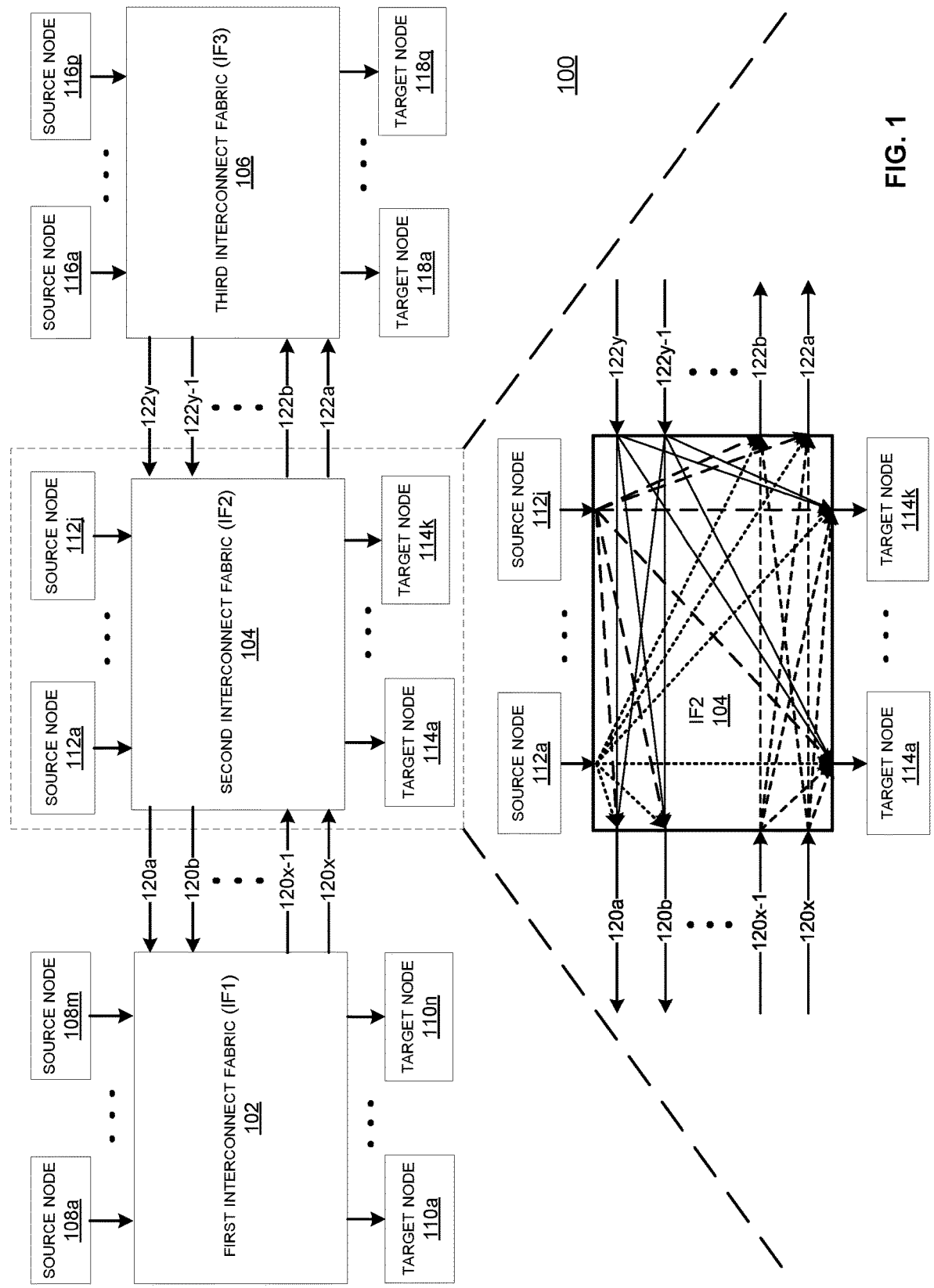
FIG. 1 illustrates a system comprising multiple interconnect fabrics connected to a plurality of source node and target nodes.

A complex system may include a plurality of system-on-chips (SoCs) to support functionalities that demand high performance and compute power such as cloud computing, databases, application hosting, machine learning, among others. Each SoC may include multiple source nodes and target nodes, e.g., CPUs, memory (e.g., DRAMs, SRAMs, register files), direct memory access (DMA) controllers, input/output (I/O) devices (e.g., I/O controllers, Peripheral Component Interconnect express (PCIe) devices, network controllers, SATA devices, UARTs, USB devices), or coprocessors (e.g., accelerator engines, crypto engines, graphical processing units (GPUs), audio processors). Various source nodes and target nodes within each SoC and across multiple SoCs may be connected via different interconnect fabrics.

Generally, when a transaction is issued by a source node, multiple routes may exist for the transaction to reach a desired target node via one or more interconnect fabrics. In some systems, certain routes can be selected during implementation phase based on an estimation of the system bandwidth and/or load balancing for the given system specification. However, in some cases, routing decisions made prior to the chip tape-out (e.g., pre-silicon) may not be the most optimal. For example, when the chip is tested in the lab (e.g., post-silicon), some routes may not perform optimally based on the traffic flow. In some cases, one of the components that the chip communicates with in a system can be replaced (e.g., to a newer version of the component), which can affect corresponding interfaces, and ultimately the system timing. In some cases, it may require a re-spin or redesign of the hardware to improve the system timing, which can be a costly process.

Certain embodiments can be used to provide a configurable and robust method to allow changing the routing between the source nodes and the target nodes in a complex system, even after the chip has taped-out. In some embodiments, a configurable address decoder can be used for each source node, and for each connection between two interconnect fabrics. Each address decoder, which is coupled to an interconnect fabric, can be configured with an address mapping table that can map an incoming transaction to one of the target nodes coupled to that interconnect fabric. Thus, a route of a transaction from a source node to a target node can be determined by configuring different address decoders on the route to direct the transaction to the final target node via corresponding interconnect fabrics.

Certain embodiments can provide flexibility in configuring each address decoder based on the system architecture. For example, the system software can determine an optimal route for a transaction to reach a final target node, and configure each address decoder on the route so that the transaction can be routed to the target node in the most optimal way via one or more interconnect fabrics. The embodiments can also allow re-configuring the address decoders to select different routes, when some of the routes need to be updated due to traffic congestion, change in one of the components of the system, or other reasons. Thus, re-spins or redesigns of the hardware can be avoided. Some embodiments can allow specifying a dedicated target node where the transaction can be routed. For example, the address mapping table in each address decoder can map an incoming transaction to a dedicated target node based on the transaction information.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates a system 100 comprising multiple interconnect fabrics connected to a plurality of source node and target nodes.

The system 100 may include a first interconnect fabric (IF1) 102 coupled to M source nodes comprising a source node 108a, and a source node 108m, and to N target nodes comprising a target node 110a, and a target node 110n. The system 100 may also include a second interconnect fabric (IF2) 106 coupled to J source nodes comprising a source node 112a, and a source node 112j, and to K target nodes comprising a target node 114a, and a target node 114k. The system 100 may also include a third interconnect fabric (IF3) 106 coupled to P source nodes comprising a source node 116a, and a source node 116p, and to Q target nodes comprising a target node 118a, and a target node 118q. The IF1 102 and the IF2 104 may be communicatively coupled via a first set of connections comprising connections 120a, 120b, 120x-1, and 120x. The IF2 104 and the IF3 106 may be communicatively coupled via a second set of connections comprising connections 122a, 122b, 122y-1, and 122y.

The multiple source nodes and target nodes in the system 100 may include CPUs, memory (e.g., DRAMs, SRAMs, register files), direct memory access (DMA) controllers, input/output (I/O) devices (e.g., I/O controllers, Peripheral Component Interconnect express (PCIe) devices, network controllers, SATA devices, UARTs, USB devices), coprocessors (e.g., accelerator engines, crypto engines, graphical processing units (GPUs), audio processors), or other suitable components. The IF1 102, IF2 104, and the IF3 106 can be implemented using meshes, rings, crossbars, nodes, switches, bridges, or other suitable components. In some implementations, the IF1 102, IF2 104, and the IF3 106 may support the Advanced Micro controller Bus Architecture (AMBA) Advanced eXtensible Interface (AXI) protocol, or AXI Coherency Protocol Extension (ACE) protocol for communication between the components.

Each interconnect fabric can allow multiple routes for a transaction received by the interconnect fabric. For example, as shown in the enlarged figure, a transaction from the source node 112a can be routed to the IF1 102 via a first connection 120a or a second connection 120b from the first set of connections, to any of the K target nodes 114a-114k, or to the IF3 106 via the connection 122a or the connection 122b. Similarly, a transaction from the source node 112j can be routed to the IF1 102 via the connection 120a or the connection 120b, to any of the K target nodes 114a-114k, or to the IF3 106 via the connection 122a or the connection 122b.

Additionally, a transaction received by the IF2 104 from the IF 1102 via the connection 120x can be routed to any of the K target nodes 114a-114k, or to the IF3 106 via the connection 122a or 122b. Similarly, a transaction received by the IF2 104 from the IF1 102 via the connection 120x-1 can be routed to any of the K target nodes 114a-114k, or to the IF3 106 via the connection 122b or 122a. A transaction received by the IF2 104 from the IF3 106 via the connection 122y can be routed to any of the K target nodes 114a-114k, or to the IF1 102 via the connection 120a or 120b. A transaction received by the IF2 104 from the IF3 106 via the connection 120y-1 can be routed to any of the K target nodes 114a-114k, or to the IF1 102 via the connection 120b or 120a.

The IF1 102 can also allow multiple routes for transactions received from the source nodes 108a-108m or the IF2 104. Similarly, the IF3 106 can also allow multiple routes for transactions received from the source nodes 116a-116p or the IF2 104. As an example, a transaction issued by the source node 108a, which is addressed to the target node 118a, can be routed via the connection 120x-1 or the connection 120x by the IF 102 to the IF2 104, via the connection 122a or the connection 122b by the IF2 104 to the IF1 106, and to the target node 118a by the IF3 106.

Generally, the routes to each target node are determined during the design phase based on an estimation of the bandwidth and/or load-balancing for the given system architecture, and cannot be altered easily without an added expense once the chip has taped-out. For example, the system 100 may be designed to route the transactions issued by the source node 108a to the target node 118a via the connections 120x-1 and 122b. However, in some cases, the assigned route may not be the most optimal, or may need to be changed for some reason. In some cases, re-spin or redesign of the chip may be required to alter the hardcoded routes after performing some tests on the silicon, or if any of the components need to be updated (e.g., change in the interface of the interconnect fabrics).

Some embodiments can provide the flexibility of changing the routes of the transactions post-silicon using address decoders, which can be configured to select a route for a transaction through various interconnect fabrics based on a final destination of the transaction. Each address decoder coupled to an interconnect fabric can be configured with a respective address mapping table that can map a set of address ranges to a corresponding set of target nodes coupled to the interconnect fabric. This is further explained with reference to FIG. 2.

Figure 2:
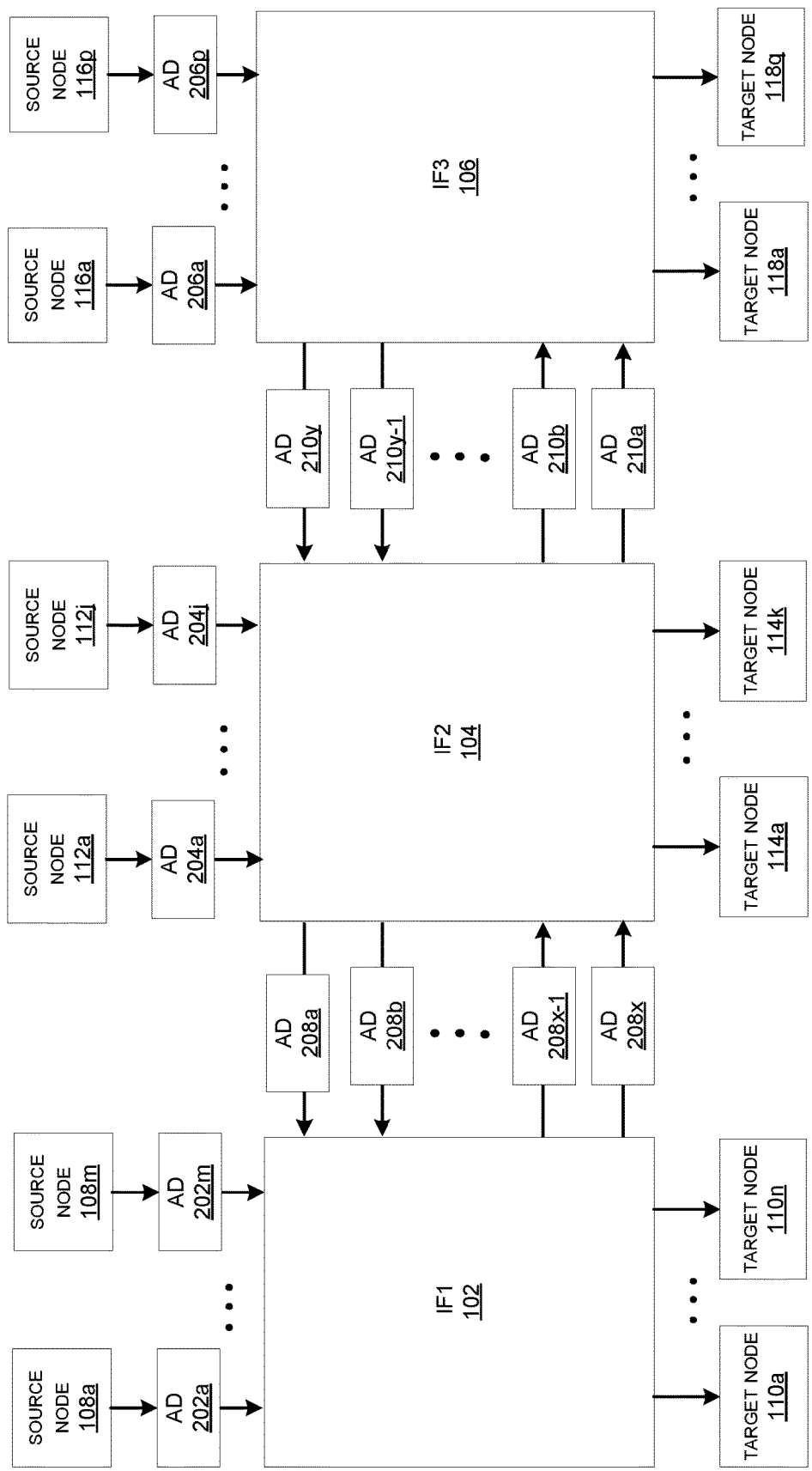
FIG. 2 illustrates an example system with a first set of address decoders coupled between the corresponding source nodes and the interconnect fabric, and a second set of address decoders coupled between two interconnect fabrics, according to some embodiments.

FIG. 2 illustrates an example system 200 with a first set of address decoders coupled between the corresponding source nodes and the interconnect fabric, and a second set of address decoders coupled between two interconnect fabrics, according to some embodiments. In some examples, the system 200 may include one or more SoCs. The system 200 may include the same source nodes, target nodes, and the interconnect fabrics, as discussed with reference to the system 100 in FIG. 1.

The system 200 may also include M address decoders comprising an address decoder (AD) 202a, and an AD 202m coupled between the corresponding M source nodes 108a-108m and the IF1 102. The system 200 may also include J address decoders comprising an AD 204a, and an AD 204j coupled between the corresponding J source nodes 112a-1 12j and the IF2 104.

The system 200 may also include P address decoders comprising an AD 206a, and an AD 206p coupled between the corresponding P source nodes 116a-116p and the IF3 106. The system 200 may also include X address decoders comprising an AD 208a, an AD 208b, an AD 208x-1, and an AD 208x between the IF1 102 and the IF2 104. The system 200 may also include Y address decoders comprising an AD 210a, an AD 210b, an AD 210y-1, and an AD 210y between the IF2 104 and the IF3 106.

Note that a first set of ADs (e.g., AD 208x-1 and AD 208x, as shown in FIG. 2) in the X address decoders may operate as a set of target nodes for the IF1 102 (or as a set of source nodes for the IF2 104), and a second set of ADs (e.g., AD 208a and AD 208b, as shown in FIG. 2) in the X address decoders may operate as a set of target nodes for the IF2 104 (or as a set of source nodes for the IF1 102). Similarly, a first set of ADs (e.g., AD 210a and AD 210b, as shown in FIG. 2) in the Y address decoders may operate as a set of target nodes for the IF2 104 (or as a set of source nodes for the IF3 106), and a second set of ADs (e.g., AD 210y-1 and AD 210y, as shown in FIG. 2) in the Y address decoders may operate as a set of target nodes for the IF3 106 (or as a set of source nodes for the IF2 104).

Each address decoder in the system 200 can be configured with a respective address mapping table to map a set of address ranges to a set of local target nodes (e.g., the target nodes coupled to the local interconnect fabric). For example, each of the M address decoders 202a-202m can be configured with a respective address mapping table that maps a set of address ranges to a set of target nodes coupled to the IF 102 (e.g., the target nodes 110a-110n, the AD 208x-1, and the AD 208x). Each of the J address decoders 204a-204m can be configured with a respective address mapping table that maps a set of address ranges to a set of target nodes coupled to the IF2 104 (e.g., the target nodes 114a-114k, the AD 208a, the AD 208b, the AD 210a, and the AD 210b). Each of the P address decoders 206a-206p can be configured with a respective address mapping table that maps a set of address ranges to a set of target nodes coupled to the IF3 106 (e.g., the target nodes 118a-118q, the AD 210y-1, and the AD 210y).

Similarly, each of the address decoders in the X address decoders 208a-208x that operate as a set of source nodes for the IF2 104 (e.g., AD 208x-1 and AD 208x) can be configured with a respective address mapping table that maps a set of address ranges to a set of target nodes coupled to the IF2 104 (e.g., the target nodes 114a-114k, the AD 210a, and the AD 210b). Each of the address decoders in the Y address decoders 210a-210y that operate as a set of source nodes for the IF2 104 (e.g., AD 210y-1 and AD 210y) can be configured with a respective address mapping table that maps a set of address ranges to a set of target nodes coupled to the IF2 104 (e.g., the target nodes 114a-114k, the AD 208a, and the AD 208b).

Additionally, each of the address decoders in the X address decoders 208a-208x that operate as a set of source nodes for the IF1 102 (e.g., AD 208a and AD 208b) can be configured with a respective address mapping table that maps a set of address ranges to a set of target nodes coupled to the IF 102 (e.g., the target nodes 110a-110n). Each of the address decoders in the Y address decoders 210a-210y that operate as a set of source nodes for the IF3 106 (e.g., AD 210a and AD 210b) can be configured with a respective address mapping table that maps a set of address ranges to a set of target nodes coupled to the IF3 106 (e.g., the target nodes 118a-118q).

Each of the IF 1102, the IF2 104, and the IF3 106 can route an incoming transaction to one of the target nodes attached to the IF1 102, the IF2 104, and the IF3 106, respectively, as determined by the corresponding address decoder. For example, the AD 202a may receive a transaction issued by the corresponding source node 108a that may include a destination address targeted to the target node 118a. The AD 202a may determine that the destination address maps to the AD 208x using its address mapping table, and provide a first target node ID to the IF1 102 for the AD 208x. The IF1 102 can route the transaction to the AD 208x using the first target node ID. The AD 208x may determine that the destination address maps to the AD 210a using its address mapping table, and provide a second target node ID to the IF2 104 for the AD 210a. The IF2 104 can route the transaction to the AD 210a using the second target node ID. The AD 210a may determine that the destination address maps to the target node 118a using its address mapping table, and provide a third target node ID to the IF3 106 for the target node 118a. The IF3 106 can route the transaction to the target node 118a using the third target node ID.

Some embodiments can allow specifying a dedicated target node to which the transaction is routed. In other words, the address mapping table can be overridden, in which case a transaction is routed to a target node that is different than what is specified in the mapping table. This can be done, for example, to perform testing operations, or when a host or a system component operating at a different hierarchy level is using a different memory map of the system than the SoCs to issue transactions. In some implementations, the address decoder can route an incoming transaction to a dedicated target node based on the transaction information. For example, the AD 202a can provide a target node ID identifying a target node in the set of target nodes coupled to the IF1 102, which corresponds to the dedicated target node (e.g., the target node 110n). The IF 102 can route the transaction to the dedicated target node.

Embodiments can allow reconfiguring the address mapping tables in each address decoder for a different route of the transaction to reach the desired target node. In some embodiments, the system software can determine that a transaction needs to be re-routed to reach the desired target node to improve load balancing or to improve timing based on the traffic, and can re-configure the corresponding address decoders to reroute the transaction accordingly. For example, if there is traffic congestion through the AD 208x and the AD 210a to reach the target node 118a, the address mapping table in the AD 202a can be updated to route the transaction to the AD 208x-1 instead of the AD 208x. The address mapping table in the AD 208x-1 can route the transaction to the AD 210b, which can further route the transaction to the target node 118a.

This is further explained with reference to FIGS. 3A-3F.

FIG. 3A illustrates an example of a first address mapping table 300 for the AD 202a, according to some embodiments. As an example, in FIG. 2, the values of M, N, J, K, P, and Q can be 2, and the values of X and Y can be 4. The first address mapping table 300 may include a mapping of each address range 300a to a corresponding target node ID 300b. As an example, an address range of 0x0000-0x007F may be mapped to a target node ID 0x01 corresponding to the target node 110a, and an address range of 0x0080-0x00FF may be mapped to a target node ID 0x02 corresponding to the target node 110n. An address range of 0x1000-0x1FFF may be mapped to a target node ID 0x03 corresponding to the AD 208x-1, and an address range of 0x2000-0x2FFF may be mapped to a target node ID 0x04 corresponding to the AD 208x.

FIG. 3B illustrates a second address mapping table 302 for the AD 208x, in some embodiments. The second address mapping table 302 may include a mapping of each address range 302a to a corresponding target node ID 302b. As an example, an address range of 0xX000-0xX07F may be mapped to a target node ID 0x01 corresponding to the target node 114a, and an address range of 0xX08-00xX0FF may be mapped to a target node ID 0x02 corresponding to the target node 114k. An address range of 0xX100-0xX1FF may be mapped to a target node ID 0x03 corresponding to the AD 210b, and an address range of 0xX200-0xX2FF may be mapped to a target node ID 0x04 corresponding to the AD 210a.

FIG. 3C illustrates a third address mapping table 304 for the AD 210a, in some embodiments. The third address mapping table 304 may include a mapping of each address range 304a to a corresponding target node ID 304b. As an example, an address range of 0xXX00-0xXX7F may be mapped to a target node ID 0x01 corresponding to the target node 118a, and an address range of 0xXX80-0xXXFF may be mapped to a target node ID 0x02 corresponding to the target node 118q.

Thus, referring back to FIG. 2, a transaction issued by the source node 108a with a destination address of 0x00A0 can be directed by the IF1 102 to the target node 110n based on the target node ID of 0x02 provided by the first address mapping table 300 in the AD 202a. Another transaction issued by the source node 108a with a destination address of 0x22F0 can be directed by the IF1 102 to the AD 208x based on the target node ID of 0x04 provided by the first address mapping table 300 in the AD 202a. The transaction may be received by the AD 208x and can be directed by the IF2 104 to the AD 210a based on the target node ID of 0x04 provided by the second address mapping table 302. The transaction may be received by the AD 210a and can be directed by the IF3 106 to the target node 118q based on the target node ID of 0x02 provided by the third address mapping table 304.

In some embodiments, the transactions can be re-routed for optimal load balancing or for some other reasons, by updating the address mapping tables in the corresponding address decoders to remap the address ranges to different target nodes. For example, the transaction with the destination address of 0x22F0 can be re-routed to the target node 118q via the AD 208x-1 and the AD 210b instead of the AD 208x and the AD 210a.

FIG. 3D illustrates an example of an updated first address mapping table 306 for the AD 202a, according to some embodiments. The updated first address mapping table 306 may include an updated mapping for the address range of 0x1000-0x1FFF to a target node ID 0x04 corresponding to the AD 208x-1, and an updated mapping for the address range of 0x2000-0x2FFF to a target node ID 0x03 corresponding to the AD 208x. Thus, the transaction with the destination address of 0x22F0 can be routed to the AD 208x-1 based on the target node ID of 0x03 provided by the updated first address mapping table 306 in the AD 202a.

FIG. 3E illustrates a fourth address mapping table 308 for the AD 208x-1, in some embodiments. The fourth address mapping table 308 may include a mapping of each address range 308a to a corresponding target node ID 308b. As an example, an address range of 0xX000-0xX07F may be mapped to a target node ID 0x01 corresponding to the target node 114a, and an address range of 0xX080-0xX0FF may be mapped to a target node ID 0x02 corresponding to the target node 114k. An address range of 0xX100-0xX1FF may be mapped to a target node ID 0x04 corresponding to the AD 210a, and an address range of 0xX200-0xX2FF may be mapped to a target node ID 0x03 corresponding to the AD 210b.

Thus, the transaction with the destination address of 0x22F0 can be received by the AD 208x-1, and can be directed by the IF2 104 to the AD 210b based on the target node ID of 0x03 provided by the fourth address mapping table 308. The transaction may be received by the AD 210b and can be directed by the IF3 106 to the target node 118q based on the target node ID of 0x02 provided by the third address mapping table 304.

Note that FIGS. 3A-3E show an example implementation of mapping the address ranges to the target node IDs, and updating the mapping tables. However, the embodiments are not limited to a specific implementation, and other implementations are possible without deviating from the scope of the disclosure.

Figure 4:
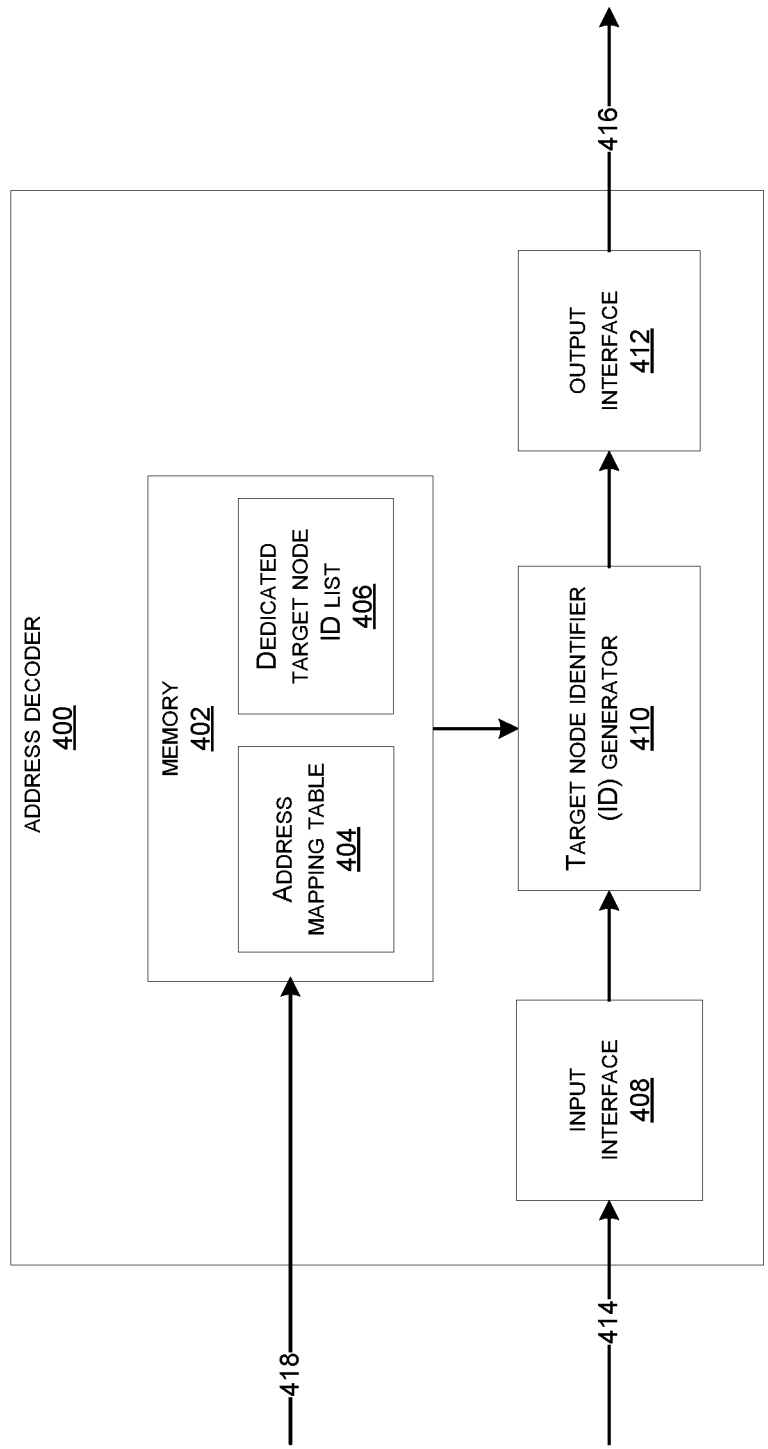
FIG. 4 illustrates an example block diagram for an address decoder, according to some embodiments.

FIG. 4 illustrates an example block diagram for an address decoder 400 according to some embodiments. The address decoder 400 can be an example of each of the AD 202a-202m, AD 208a-208x, AD 204a-204j, AD 210a-210y, and the AD 206a-206p, as described with reference to FIG. 2.

The address decoder 400 may include a memory 402, an input interface 408, a target node identifier (ID) generator 410, an output interface 412, and a system interface 418. The memory 402 may include an address mapping table 404 and a dedicated target node ID list 406 for the address decoder 400. The address mapping table 404 and the dedicated target node ID list 406 can be programmed using the system interface 418. For example, the system 200 may include a host processor (or another component in the system) that may be configured to execute instructions to configure the address mapping table 404 and the dedicated target node ID list 406.

The address mapping tables 300-308 described with reference to FIGS. 3A-3E can be examples of the address mapping table 404. In some examples, the address mapping table 404 may include a default configuration at reset. The dedicated target node ID list 406 may include one or more target node IDs where the transaction can be directed to irrespective of the destination address of the transaction, or the target node ID indicated by the corresponding address mapping table. In some examples, the one or more target node IDs may correspond to target nodes that are mapped to different address maps. The memory 402 can be implemented using any suitable memory type including registers, or SRAMs.

The input interface 408 may be configured to receive transaction information 414. For example, the transaction information 414 may include a destination address, data, a source identifier, a destination identifier, controls, and any other suitable information. In some embodiments, when the AXI protocol is used for communicating the transaction, the transaction information may also include AXI USER bits, which can be used to determine whether a dedicated target node is to be selected.

The target node ID generator 410 may be configured to generate a target node ID based on the address mapping table 404, or on an indication in the transaction information 414 for a dedicated target node. For example, the dedicated target node ID can be selected from the dedicated target node ID list 406 based on the indication in the transaction information 414 for a dedicated target node. The target node ID or the dedicated target node ID can be provided on an output 416 to an interconnect fabric coupled to the address decoder 400 via the output interface 412. The output 416 can be coupled to an interconnect fabric, which can use the target node ID or the dedicated target node ID to route the transaction.

Figure 5:
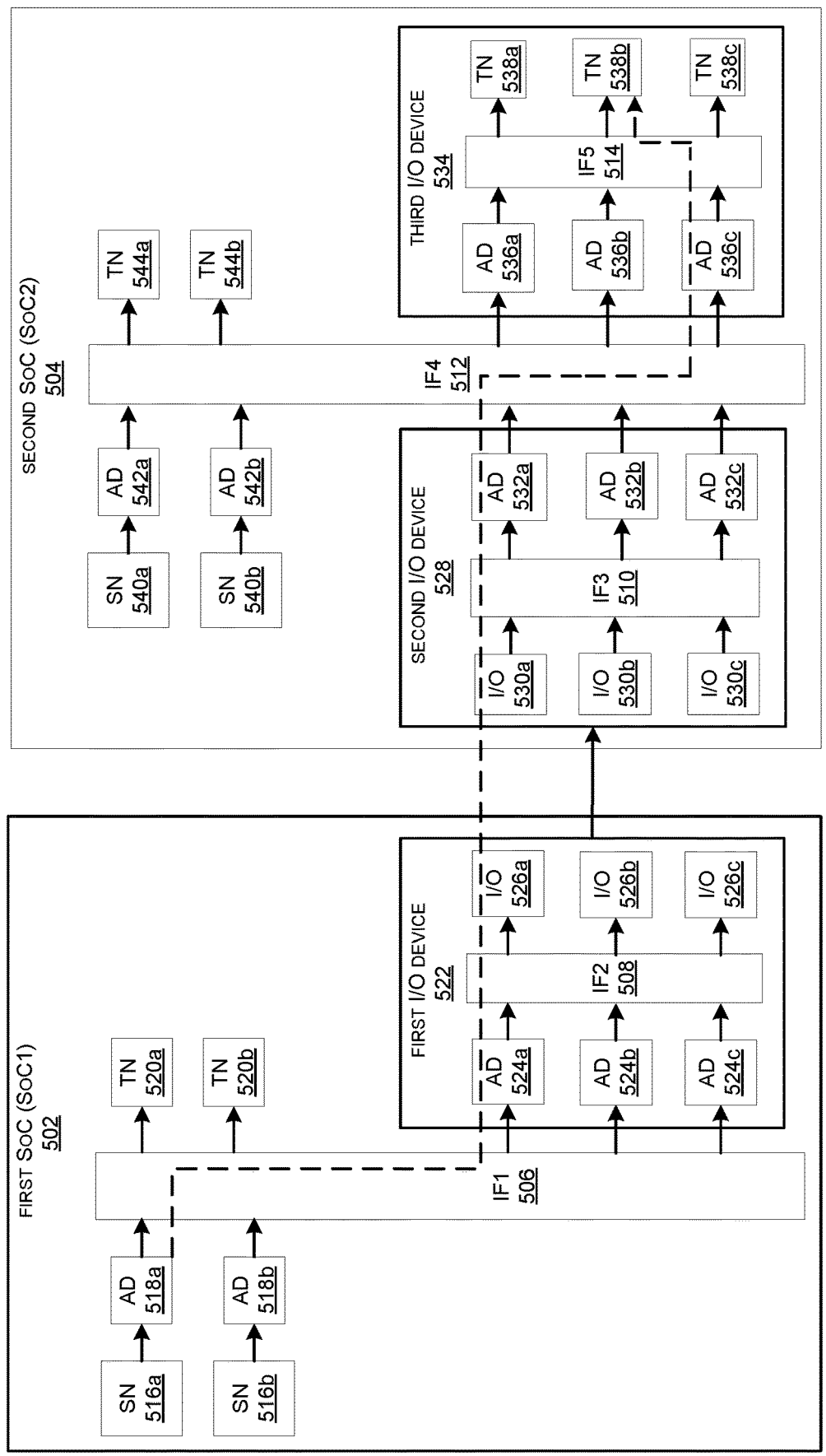
FIG. 5 illustrates a system comprising a first SoC and a second SoC, in accordance with some embodiments.

FIG. 5 illustrates a system 500 comprising a first SoC (SoC1) 502 and a second SoC (SoC2) 504, in accordance with some embodiments.

The SoC1 502 may include a first interconnect fabric (IF1) 506 coupled to a target node (TN) 520a and a TN 520b. An address decoder (AD) 518a may be coupled between a source node (SN) 516a and the IF1 506, and an AD 518b may be coupled between an SN 516b and the IF1 506. The IF1 506 may also be coupled to a first I/O device 522 comprising a second interconnect fabric (IF2) 508. An AD 524a may be coupled between the IF1 506 and the IF2 508, an AD 524b may be coupled between the IF1 506 and the IF2 508, and an AD 524c may be coupled between the IF1 506 and the IF2 508. The IF2 508 may also be coupled to an I/O 526a, an I/O 526b, and an I/O 526c.

The SoC2 502 may include a second I/O device 528 comprising a third interconnect fabric (IF3) 510. The IF3 510 may be coupled to an I/O 530a, an I/O 530b, and an I/O 530c. The I/O 530a, I/O 530b, and the I/O 530c may be configured to communicate with the I/O 526a, I/O 526b, and the I/O 526c on the SOC1 502 using an interface such as PCIe, QuickPath Interconnect (QPI), Ultra Path Interconnect (UPI), or a proprietary interface. In some examples, the first I/O device 522 and the second I/O device 528 may include I/O controllers, hubs, bridges, or other suitable devices that can be configured to enable communication between the SoC1 502 and the SOC2 504. For example, the I/Os 526a-526c, and the I/Os 530a-530c may include ports, pins, transmitters, receivers, buffers, or other suitable components based on the implementation.

The SoC2 504 may also include a fourth interconnect fabric (IF4) 512 coupled to a TN 544a and a TN 544b. An AD 542a may be coupled between an SN 540a and the IF4 512, and an AD 542b may be coupled between an SN 540b and the IF4 512. An AD 532a may be coupled between the IF3 510 and the IF4 512, an AD 532b may be coupled between the IF3 510 and the IF4 512, and an AD 532c may be coupled between the IF3 510 and the IF4 512. The IF4 512 may also be coupled to a third I/O device 534 comprising a fifth interconnect fabric (IF5) 514.

An AD 536a may be coupled between the IF4 512 and the IF5 514, an AD 536b may be coupled between the IF4 512 and the IF5 514, and an AD 536c may be coupled between the IF4 512 and the IF5 514. The IF5 514 may also be coupled to a TN 538a, a TN 538b, and a TN 538c.

The AD 518a may be configured with an address mapping table that can map a set of address ranges to the TN 520a, TN 520b, AD 524a, AD 524b, and the AD 524c coupled to the IF1 506. Similarly, the AD 518b may be configured with an address mapping table that can map a set of address ranges to the TN 520a, TN 520b, AD 524a, AD 524b, and the AD 524c coupled to the IF1 506.

The AD 524a may be configured with an address mapping table that can map a set of address ranges to the AD 532a, AD 532b, and the AD 532c, the AD 524b may be configured with an address mapping table that can map a set of address ranges to the AD 532a, AD 532b, and the AD 532c, and the AD 524c may be configured with an address mapping table that can map a set of address ranges to the AD 532a, AD 532b, and the AD 532c. The ADs 524a-524c and the ADs 532a-532c may be configured to determine a route for communication between the SoC1 502 and the SoC2 504.

The AD 542a may be configured with an address mapping table that can map a set of address ranges to the TN 544a, TN 544b, AD 536a, AD 536b, and the AD 536c coupled to the IF4 512. Similarly, the AD 542b may be configured with an address mapping table that can map a set of address ranges to the TN 544a, TN 544b, AD 536a, AD 536b, and the AD 536c coupled to the IF4 512. The AD 532a may be configured with an address mapping table that can map a set of address ranges to the TN 544a, TN 544b, AD 536a, AD 536b, and the AD 536c coupled to the IF4 512. The AD 532b may be configured with an address mapping table that can map a set of address ranges to the TN 544a, TN 544b, AD 536a, AD 536b, and the AD 536c coupled to the IF4 512. The AD 532c may be configured with an address mapping table that can map a set of address ranges to the TN 544a, TN 544b, AD 536a, AD 536b, and the AD 536c coupled to the IF4 512.

The AD 536a may be configured with an address mapping table that can map a set of address ranges to the TN 538a, TN 538b, and the TN 538c coupled to the IF5 514. The AD 536b may be configured with an address mapping table that can map a set of address ranges to the TN 538a, TN 538b, and the TN 538c coupled to the IF5 514. The AD 536c may be configured with an address mapping table that can map a set of address ranges to the TN 538a, TN 538b, and the TN 538c coupled to the IF5 514.

As an example, the AD 518a may receive a transaction from the SN 516a that is targeted to the TN 538b. For example, the SN 516a can be a network controller, and the TN 538b can be a PCIe device. The AD 518a may determine that the destination address maps to the AD 524a based on its address mapping table, and the IF1 506 may route the transaction to the AD 524a. The AD 524a may determine that the destination address maps to the AD 532a based on its address mapping table, and the IF2 508 may route the transaction to the AD 532a via the I/Os 526a-526c and 530a-530c. The AD 532a may determine that the destination address maps to the AD 536c based on its address mapping table, and the IF4 512 may route the transaction to the AD 536c. The AD 536c may determine that the destination address maps to the TN 538b based on its address mapping table, and the IF5 514 may route the transaction to the TN 538b.

Furthermore, some embodiments can allow re-routing the transaction from the SN 516a to the TN 538b by re-configuring the address decoders on the route. For example, the AD 518a can be reconfigured to direct the transaction to the AD 524c via the IF1 506 instead of the AD 524a. The AD 524c can further direct the transaction to the AD 532c via the I/Os 526a-526c and 530a-530c. The AD 532c can direct the transaction to the AD 536a via the IF4 512, which can direct the transaction to the TN 538b via the IF5 514.

Figure 6:
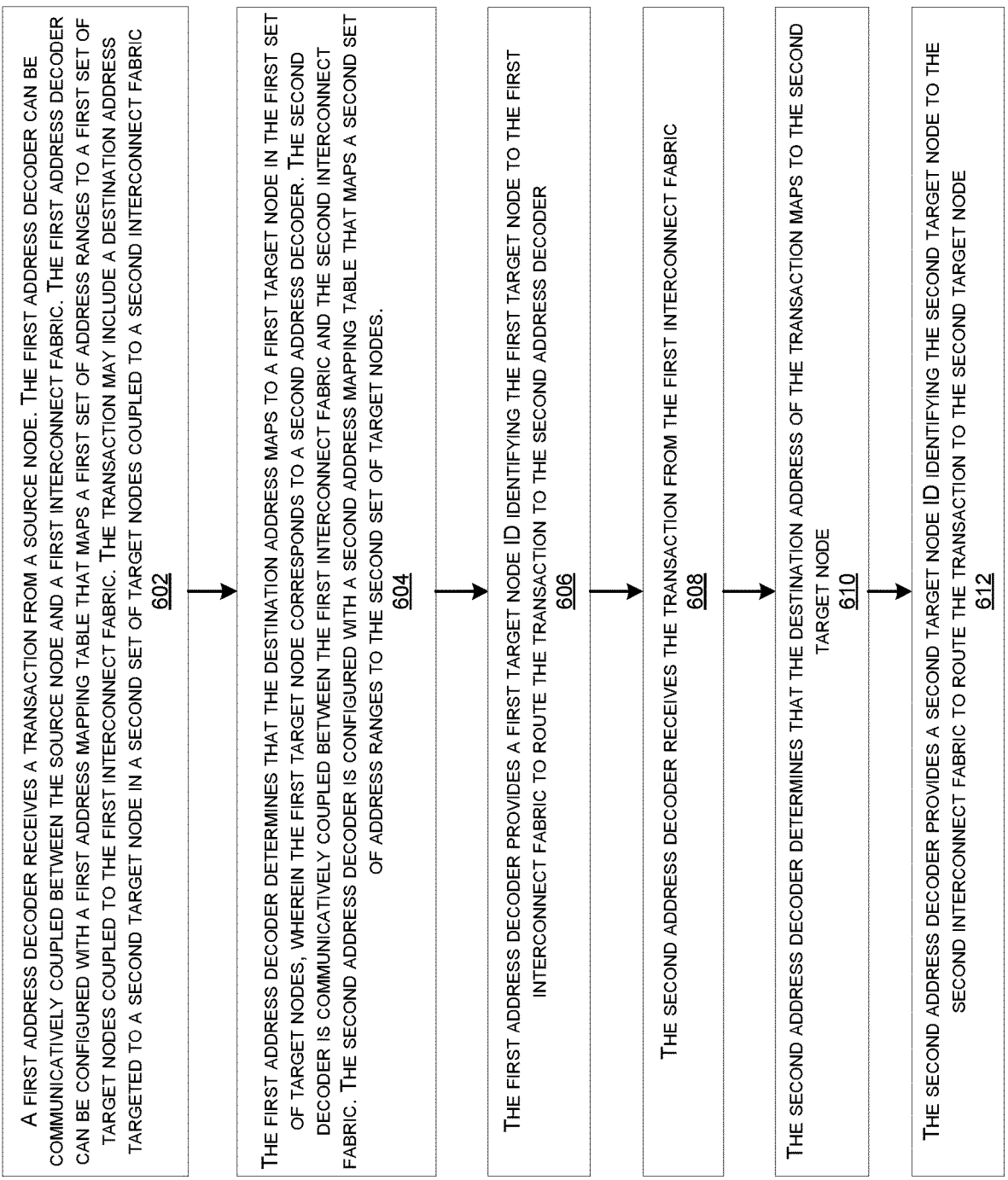
FIG. 6 illustrates a flow chart for a method executed by an address decoder in an SoC, according to some embodiments.

FIG. 6 illustrates a flow chart 600 for a method executed by an integrated circuit, according to some embodiments. In some examples, the integrated circuit can be an SoC, or a multi-chip system comprising multiple SoCs. For example, the integrated circuit can include the system 200 or the system 500.

In step 602, the method may include receiving, by a first address decoder, a transaction from a source node. The first address decoder can be communicatively coupled between the source node and a first interconnect fabric, and the first address decoder can be configured with a first address mapping table that maps a first set of address ranges to a first set of target nodes coupled to the first interconnect fabric. The transaction can include a destination address targeted to a second target node in a second set of target nodes coupled to a second interconnect fabric. For example, the first address decoder can be the AD 202a coupled between the source node 108a and the IF1 102, which may be configured with the first address mapping table 300, as discussed with reference to FIG. 2 and FIG. 3A. The transaction may include a destination address of value 0x106F that corresponds to the target node 114a coupled to the IF2 104.

In step 604, the method may include determining, by the first address decoder, that the destination address maps to a first target node in the first set of target nodes. The first target node may correspond to a second address decoder, which is communicatively coupled between the first interconnect fabric and a second interconnect fabric. The second address decoder may be configured with a second address mapping table that maps a second set of address ranges to the second set of target nodes. The AD 202a may determine that the destination address maps to the AD 208x-1, which is coupled to the IF2 104, based on the first address mapping table 300.

In step 606, the method may include providing, by the first address decoder, a first target node identifier (ID) identifying the first target node to the first interconnect fabric to route the transaction to the second address decoder. As discussed with reference to FIG. 4, the target node ID generator 410 in the AD 202a may provide the target node ID 300b on the output 416 as 0x03 to the IF1 102 via the output interface 412. The IF1 102 can route the transaction to the AD 208x-1 using the target node ID 300b.

In step 608, the method may include receiving, by the second address decoder, the transaction from the first interconnect fabric. The AD 208x-1 may receive, from the IF1 102, the transaction information 414 for the transaction via the input interface 408.

In step 610, the method may include determining, by the second address decoder, that the destination address of the transaction maps to the second target node. The AD 208x-1 may determine that the destination address of the transaction with the value 0x106F maps to the target node 114a based on the second address mapping table 302.

In step 612, the method may include providing, by the second address decoder, a second target node ID identifying the second target node to the second interconnect fabric to route the transaction to the second target node. The target node ID generator 410 in the AD 208x-1 may provide the target node ID 302b on the output 416 as 0x01 to the IF2 104 via the output interface 412. The IF2 104 can route the transaction to the target node 114a using the target node ID 302b.

In some examples, the AD 202a may be re-configured with the updated first address mapping table 306 as described with reference to FIG. 3D. Thus, the transaction can be routed by the IF2 104 to the target node 114a via the AD 208x instead of the AD 208x-1.

In some examples, the transaction may include an indication to route the transaction to a dedicated target node corresponding to a local target node in the first set of target nodes. For example, the target node ID generator 410 in the AD 202a may generate a target node ID corresponding to the target node 110a based on the transaction information 414, and the IF1 102 can route the transaction to the target node 110a instead of routing the transaction to the AD 208x-1.

Some embodiments can provide a robust and flexible method, which can allow re-configuring the address decoders to select different routes, when some of the routes need to be updated due to traffic congestion, change in one of the components of the system, or other reasons. Thus, re-spins or redesigns of the hardware can be avoided. Some embodiments can allow specifying a dedicated target node where the transaction can be routed. For example, each address decoder can map an incoming transaction to a dedicated target node based on the transaction information, which can be used for testing operations, or to access target nodes according to different address maps.

Figure 7:
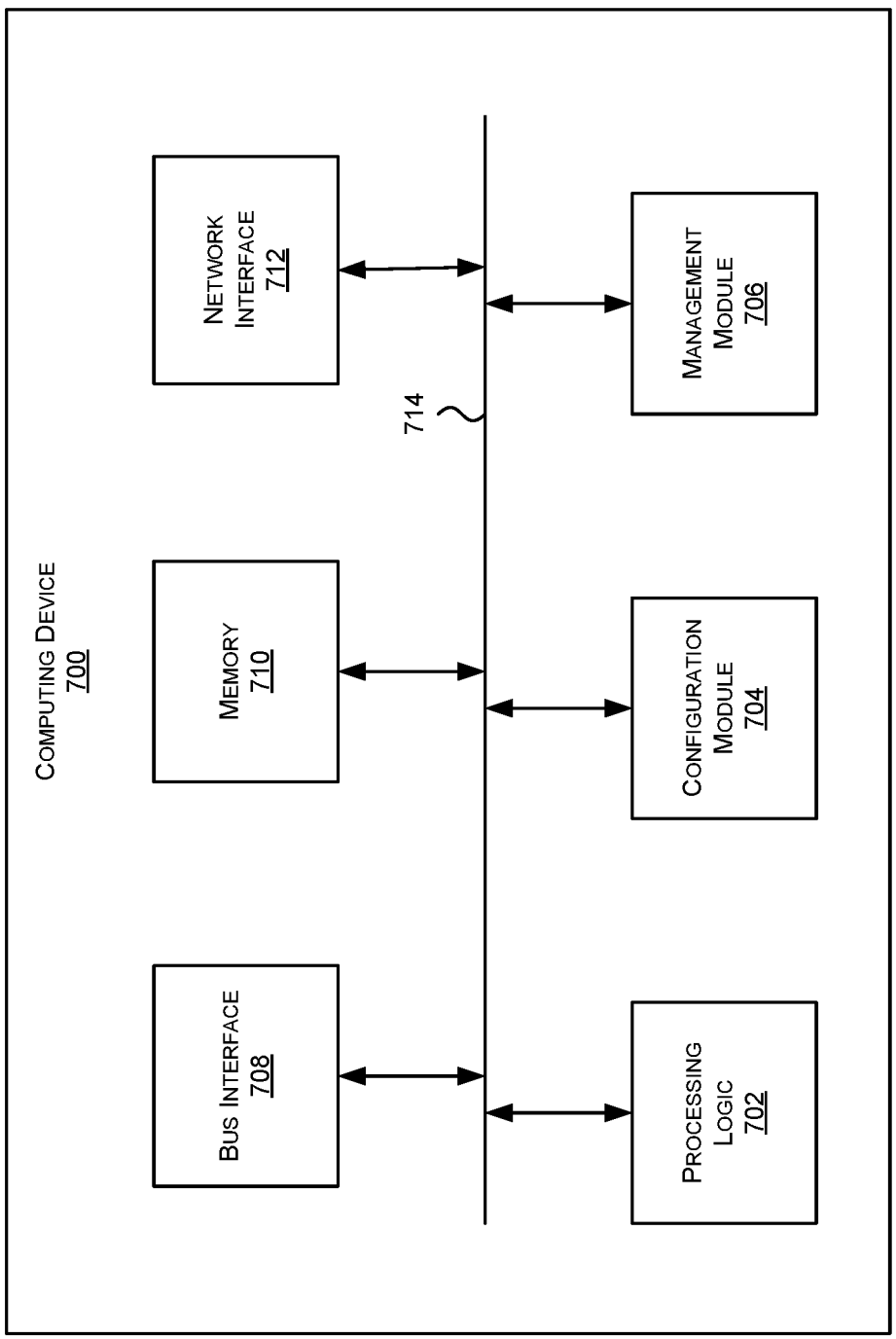
FIG. 7 illustrates an example of a computing device, according to certain aspects of the disclosure.

FIG. 7 illustrates an example of a computing device 700. Functionality and/or several components of the computing device 700 may be used without limitation with other embodiments disclosed elsewhere in this disclosure, without limitations (e.g., with reference to FIGS. 1-6). The computing device 700 may facilitate processing of packets and/or forwarding of packets from the computing device 700 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 700 may be the recipient and/or generator of packets. In some implementations, the computing device 700 may modify the contents of the packet before forwarding the packet to another device. The computing device 700 may be a peripheral device coupled to another computer device, a switch, a router or any other suitable device enabled for receiving and forwarding packets.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, which are not illustrated here. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions, or any other circuitry configured to perform logical arithmetic and floating point operations. Examples of processors that may be included in the processing logic 702 may include processors developed by ARM©, MIPS©, AMD©, Intel©, Qualcomm©, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include random access memory (RAM), read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium.

The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 702.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 702.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 8, FIG. $$$, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system-on-a-chip (SoC) comprising:
   a set of source nodes configured to issue transactions;
   a first interconnect fabric coupled to a first set of target nodes;
   a first set of address decoders, wherein each address decoder in the first set of address decoders is coupled to a corresponding source node in the set of source nodes, and to the first interconnect fabric;
   a second interconnect fabric coupled to a second set of target nodes; and
   a second set of address decoders coupled between the first interconnect fabric and the second interconnect fabric, wherein the second set of address decoders is part of the first set of target nodes,
   wherein each address decoder in the first set of address decoders is configured with a respective first address mapping table that maps a respective first set of address ranges to the first set of target nodes coupled to the first interconnect fabric,
   wherein each address decoder in the second set of address decoders is configured with a respective second address mapping table that maps a respective second set of address ranges to the second set of target nodes coupled to the second interconnect fabric, and
   wherein one or more address mapping tables in the first set of address decoders or in the second set of address decoders are reconfigurable to allow routing of transactions through the first interconnect fabric or the second interconnect fabric to be modified.

2. The SoC of claim 1, wherein each address decoder in the first set of address decoders is further configured to provide a respective target node identifier (ID) identifying a target node in the first set of target nodes to the first interconnect fabric to route a transaction received from the corresponding source node to the identified target node.

3. The SoC of claim 1, wherein each address decoder in the second set of address decoders is further configured to provide a respective target node ID identifying a target node in the second set of target nodes to the second interconnect fabric to route a transaction received from the first interconnect fabric to the identified target node.

4. The SoC of claim 1, wherein each address decoder in the first set of address decoders is further configured to provide a respective target node ID identifying a target node in the first set of target nodes to the first interconnect fabric to route a transaction received from the corresponding source node to a dedicated target node as indicated in the transaction.

5. An integrated circuit, comprising:
   a source node;
   a first interconnect fabric;
   a first address decoder communicatively coupled between the source node and the first interconnect fabric, the first address decoder configured with a first address mapping table that maps a first set of address ranges to a first set of target nodes coupled to the first interconnect fabric;
   a second interconnect fabric; and
   a second address decoder communicatively coupled between the first interconnect fabric and the second interconnect fabric, the second address decoder configured with a second address mapping table that maps a second set of address ranges to a second set of target nodes coupled to the second interconnect fabric, wherein the second address decoder corresponds to a first target node in the first set of target nodes.

6. The integrated circuit of claim 5, wherein the first address decoder is configured to:
   receive a transaction from the source node that includes a destination address targeted to a second target node in the second set of target nodes;
   determine that the destination address maps to the first target node; and
   provide a first target node identifier (ID) identifying the first target node to the first interconnect fabric to route the transaction to the second address decoder.

7. The integrated circuit of claim 6, wherein the second address decoder is configured to:
   receive the transaction from the first interconnect fabric;
   determine that the destination address of the transaction maps to the second target node; and
   provide a second target node ID identifying the second target node to the second interconnect fabric to route the transaction to the second target node.

8. The integrated circuit of claim 5, wherein the first address decoder is configured to:
   receive a transaction that includes an indication to route the transaction to a dedicated target node corresponding to a third target node in the first set of target nodes; and
   provide a target node ID identifying the third target node to the first interconnect fabric to route the transaction to the third target node.

9. The integrated circuit of claim 6, wherein the first address decoder is reconfigured with an updated first address mapping table, and wherein the second address decoder is remapped to a third target node in the first set of target nodes according to the updated first address mapping table.

10. The integrated circuit of claim 9, wherein the first address decoder is further configured to:
    receive another transaction from the source node that includes a destination address targeted to the second target node in the second set of target nodes;
    determine that the destination address maps to the third target node based on the updated first address mapping table; and
    provide a third target node ID identifying the third target node to the first interconnect fabric to route the transaction to the second address decoder.

11. The integrated circuit of claim 9, wherein the first address decoder is reconfigured with the updated first address mapping table without a hardware redesign of the integrated circuit.

12. The integrated circuit of claim 6, wherein the integrated circuit further comprises a third address decoder communicatively coupled between the first interconnect fabric and the second interconnect fabric, the third address decoder configured with a third address mapping table that maps a third set of address ranges to the second set of target nodes coupled to the second interconnect fabric, wherein the third address decoder corresponds to a third target node in the first set of target nodes, and wherein the first address decoder is further configured to:
- receive another transaction from the source node that includes a destination address targeted to a fourth target node in the second set of target nodes;
- determine that the destination address maps to the third target node; and
- provide a third target node ID identifying the third target node to the first interconnect fabric to route the transaction to the third address decoder.

13. The integrated circuit of claim 12, wherein the third address decoder is configured to:
- receive the other transaction from the first interconnect fabric;
- determine that the destination address of the other transaction maps to the fourth target node; and
- provide a fourth target node ID identifying the fourth target node to the second interconnect fabric to route the transaction to the fourth target node.

14. The integrated circuit of claim 5, wherein the integrated circuit is a system-on-a-chip (SoC).

15. The integrated circuit of claim 5, wherein the integrated circuit is a multi-chip system comprising a first SoC and a second SoC, and wherein the first interconnect fabric is on the first SoC, and the second interconnect fabric is on the second SoC.

16. The integrated circuit of claim 6, wherein the source node is a network controller, and the second target node is a Peripheral Component Interconnect express (PCIe) device.

17. A method performed by an integrated circuit, comprising:
- receiving, by a first address decoder, a transaction from a source node, wherein the first address decoder is communicatively coupled between the source node and a first interconnect fabric, wherein the first address decoder is configured with a first address mapping table that maps a first set of address ranges to a first set of target nodes coupled to the first interconnect fabric, and wherein the transaction includes a destination address targeted to a second target node in a second set of target nodes coupled to a second interconnect fabric;
- determining, by the first address decoder, that the destination address maps to a first target node in the first set of target nodes, wherein the first target node corresponds to a second address decoder, the second address decoder communicatively coupled between the first interconnect fabric and the second interconnect fabric, and wherein the second address decoder is configured with a second address mapping table that maps a second set of address ranges to the second set of target nodes;
- providing, by the first address decoder, a first target node identifier (ID) identifying the first target node to the first interconnect fabric to route the transaction to the second address decoder;
- receiving, by the second address decoder, the transaction from the first interconnect fabric;
- determining, by the second address decoder, that the destination address of the transaction maps to the second target node; and
- providing, by the second address decoder, a second target node ID identifying the second target node to the second interconnect fabric to route the transaction to the second target node.

18. The method of claim 17, further comprising:
- re-configuring the first address decoder with an updated first address mapping table;
- receiving, by the first address decoder, another transaction from the source node, wherein the other transaction includes a destination address also targeted to the second target node in the second set of target nodes;
- determining, by the first address decoder, that the destination address of the other transaction maps to a third target node in the first set of target nodes based on the updated first address mapping table, wherein the third target node corresponds to a third address decoder, the third address decoder communicatively coupled between the first interconnect fabric and the second interconnect fabric, and wherein the third address decoder is configured with a third address mapping table that maps a third set of address ranges to the second set of target nodes;
- and providing, by the first address decoder, a third target node ID identifying the third target node to the first interconnect fabric to route the transaction to the third address decoder.

19. The method of claim 18, further comprising:
- receiving, by the third address decoder, the other transaction from the first interconnect fabric;
- determining, by the third address decoder, that the destination address of the other transaction maps to the second target node; and
- providing, by the third address decoder, a fourth target node ID identifying the second target node to the second interconnect fabric to route the transaction to the second target node.

20. The method of claim 17, further comprising:
- determining, by the second address decoder, that the transaction includes an indication to route the transaction to a dedicated target node corresponding to a third target node in the second set of target nodes; and
- providing, by the second address decoder, a third target node ID identifying the third target node to the second interconnect fabric to route the transaction to the third target node.

* * * * *